United States Patent [19]

Meyer, IV et al.

[11] Patent Number: 5,642,776
[45] Date of Patent: Jul. 1, 1997

[54] ELECTRICALLY INSULATED ENVELOPE HEAT PIPE

[75] Inventors: George A. Meyer, IV, Conestoga; Scott D. Garner, Lititz, both of Pa.

[73] Assignee: Thermacore, Inc., Lancaster, Pa.

[21] Appl. No.: 607,897

[22] Filed: Feb. 27, 1996

[51] Int. Cl.$^6$ .................................................. F28D 15/00
[52] U.S. Cl. ............................... 165/104.26; 165/46
[58] Field of Search .................... 165/104.26, 104.33, 165/46; 257/715; 361/700, 705, 706

[56] References Cited

U.S. PATENT DOCUMENTS

| | | | |
|---|---|---|---|
| 3,613,778 | 10/1971 | Feldman, Jr. | 165/104.26 |
| 3,943,964 | 3/1976 | Asselman et al. | 165/104.26 X |
| 4,212,347 | 7/1980 | Eastman | 165/104.26 |
| 4,279,294 | 7/1981 | Fitzpatrick et al. | 165/104.26 |
| 5,000,256 | 3/1991 | Tousignant | 165/104.33 |
| 5,343,940 | 9/1994 | Jean | 165/104.33 |
| 5,411,077 | 5/1995 | Tousignant | 165/104.33 |
| 5,458,189 | 10/1995 | Larson et al. | 165/46 X |
| 5,485,671 | 1/1996 | Larson et al. | 165/104.33 X |

FOREIGN PATENT DOCUMENTS 0059581  9/1982  European Pat. Off. ............. 165/46

*Primary Examiner*—John Rivell
*Assistant Examiner*—Christopher Atkinson
*Attorney, Agent, or Firm*—Martin Fruitman

[57] ABSTRACT

The disclosure is for a heat pipe in the form of a simple foil envelope and a method of constructing such a heat pipe. Two plastic coated metal foil sheets are sealed together on all four edges to enclose a semi-rigid channeled sheet of plastic foam, and the envelope is evacuated and loaded with a suitable quantity of liquid to act as a heat pipe. Despite the use of the essentially poor thermally conductive materials such as the plastic coating on the surface of the casing and the foam plastic for the wick, the apparatus operates well as a heat spreader for an integrated circuit chip placed in contact with the envelope surface. The heat is transferred across the thin plastic coating with only a small temperature differential, and the foam plastic wick with channels efficiently transports condensed liquid back to the heat input location for evaporation.

13 Claims, 2 Drawing Sheets

ELECTRICALLY INSULATED ENVELOPE HEAT PIPE

BACKGROUND OF THE INVENTION

This invention deals generally with heat transfer and more specifically with a heat pipe constructed of non-traditional materials and the method of constructing such a heat pipe.

Heat pipes are devices which are well established in the art of heat transfer. A heat pipe is essentially a closed system of heat transfer in which a small amount of liquid within a sealed and evacuated enclosure is cycled through an evaporation and condensation cycle. Heat entering the enclosure at one location on the casing evaporates liquid at that location, producing vapor which moves to a cooler location on the casing where it is condensed. The movement of the vapor is motivated by a small vapor pressure differential between the evaporator and the condenser locations. The heat transfer is accomplished when the heat of vaporization, which produces the vapor, is essentially moved with the vapor to the condenser location where it is given up as the heat of condensation.

In order for the heat transfer to continue, the condensed liquid must be returned from the condenser to the evaporator where it will again be vaporized. Although this return can be accomplished by something as simple as gravity, capillary wicks have generally been used to permit heat pipes to be independent of the effects of gravity. Such a wick extends from a location near the condenser, where the liquid originates, to a location at the evaporator where it is needed for evaporation.

Both the casing and the wicks in conventional heat pipes are constructed of materials with good heat conductivity. Casings are traditionally made of copper or other metals, and are made with walls of sufficient thickness to assure that they are structurally sufficient to withstand the vapor pressures within the heat pipe, and that they are not porous to either the vapor or non-condensible gases outside the heat pipe casing.

Wicks are also usually made of materials which are considered to be heat conductive. In fact, considerable efforts have been expended to develop materials which are both heat conductive and act as capillary structures. The most common such materials are metal screen used in multiple layers and metal powder sintered into a structure attached to the casing. The heat conductive property of such wicks has been considered vital so that the heat entering the heat pipe will be conducted into and through the wick at the evaporator and vaporize the liquid within the wick. It is also generally considered a requirement of heat pipe construction that the wick be attached to the casing wall at the evaporator, so that the input heat has direct access to the liquid in the wick.

However, there are applications for which the conventional heat pipe structure is not satisfactory. Metal casings and metal wicks add weight, rigidity, and electrical conductivity to heat pipes, but that makes them unusable in some situations. Portable computers, the so-called "laptops", are one application in which traditional heat pipes are difficult to use. In such situations, weight and space are extremely critical, and the tight packing of components makes it likely that electrical components would be shorted out if an electrically conductive heat pipe casing is used. Furthermore, the costs of metal casings and sintered wicks are prohibitive in the highly competitive market of portable computers.

SUMMARY OF THE INVENTION

The present invention overcomes the weight, space, electrical insulation, and cost problems associated with the use of traditional rigid metal casings for heat pipes to cool integrated circuits in portable computers. The invention uses plastic coated thin metal foil for the casing and light weight, heat insulating foam sheet for the wick.

The invention is essentially a heat pipe in the form of a simple foil envelope. Two plastic coated metal foil sheets are sealed together on all four edges to enclose a semi-rigid sheet of plastic foam with channels cut in its surfaces, and the envelope is evacuated and loaded with a suitable quantity of water to act as a heat pipe. Despite the use of the essentially poor thermally conductive materials of the plastic coating on the surface of the casing and the foam plastic for the wick, the apparatus operates quite satisfactorily as a heat spreader for an integrated circuit chip placed in contact with the envelope surface.

The heat from the circuit chip is transferred across the exceptionally thin foil and its plastic coatings to vaporize the liquid within the heat pipe. The foam sheet plastic wick and the channels in its surface are used to transport condensed liquid back to the inside wall of the envelope at the heat input location for evaporation, and the wick is not used, as in most heat pipes, as a critical integral part of the evaporator. The channels in the surface of the wick structure also serve as vapor spaces through which the vapor moves from the evaporator location to the condenser location.

Some liquid, particularly that on the surface of the foam wick, will be vaporized by the applied heat, and that liquid will be continuously replaced by the capillary action of the wick and the channels. The action of the wick furnishing liquid to the evaporator on the envelope wall is enhanced by holding the envelope as tightly against the flat surfaces of the wick as possible. This intimate contact is assured as long as the internal vapor pressure within the heat pipe is less than the atmospheric pressure. However, any small space existing between the envelope and the wick surface is itself usually small enough to also act as a capillary structure and also acts as vapor space in which vapor moves to the condenser.

Moreover, regardless of how tightly the envelope fits around the sheet wick, the sheet material of the envelope is separated from the edges of the wick sheet enough to form generous spaces for the movement of vapor throughout the entire heat pipe.

At the condenser of the heat pipe, as the vapor is condensed, the heat leaves the heat pipe through the very thin wall of plastic coated metal foil. Typically this heat removal is encouraged by a surface exposed to the air outside the device within which the heat pipe is installed. It is important to recognize that, while the heat input typically enters from the relatively small surface area of an integrated circuit, the entire balance of the envelope surface area can and does act as the condenser. The exposed outside surface area of the heat pipe envelope can easily be 70 square inches. With such a large area available, the resulting power density transferred through the envelope wall at the condenser is small and the temperature differential is also minimal. Moreover, the large surface area available for convection or radiation cooling makes the task of heat removal relatively simple.

The plastic coating on the metal foil envelope, although a slight barrier to heat transfer across the thickness of the casing, is a vital part of the invention. The plastic layers furnish the necessary electrical insulation to prevent harm to the electrical components of the device being cooled. The plastic layers also permit the use of very thin metal foil, which would otherwise exhibit too great a porosity to maintain the vacuum integrity of the heat pipe.

The method of constructing the heat pipe is also the essence of simplicity. The envelope is formed by conventional techniques for bonding together sheets of plastic coated metal foil. These commercially available processes are used to bond together the edges of two sheets with heat and pressure. The envelope is formed tightly around an appropriately dimensioned sheet of plastic foam, but an access opening into the internal volume is left unsealed in one edge.

Purified water is then loaded into the envelope through the access opening until the envelope is full of water, thus forcing all the air out of the envelope. The water is then used to create the internal vacuum within the envelope by heating and evaporating most of the water out of the envelope and then sealing the access opening of the envelope as the water vapor is still moving out of the access opening.

Thus, although conventional wisdom dictates that all materials in a heat pipe should be good conductors of heat, the present invention provides a useful heat pipe using materials which are essentially considered to be heat insulators and improper for use in heat pipes.

DETAILED DESCRIPTION OF THE INVENTION

Figure 1:
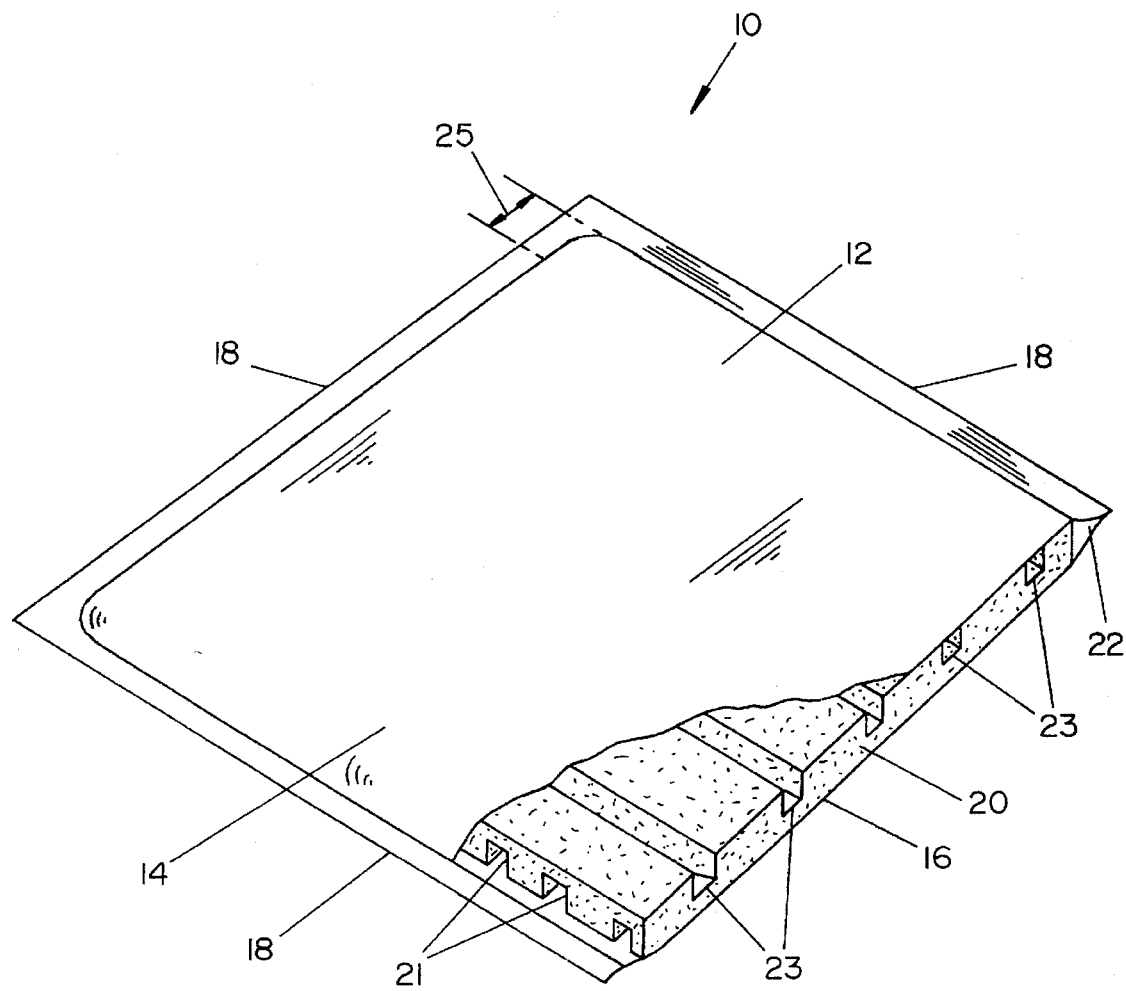
FIG. 1 is a perspective view of the preferred embodiment of the invention with a portion of the envelope cut away to show the internal structure.

FIG. 1 is a perspective view of the preferred embodiment of heat pipe 10 of the invention with a portion of the envelope cut away to show the internal structure.

Heat pipe 10 is constructed of only a very few parts. Envelope 12 is constructed of top sheet 14 sealed to bottom sheet 16 around their peripheral edges 18 (one edge not shown). Foam sheet wick 20 is located within envelope 12, and foam sheet 20 and envelope 12 are dimensioned so that foam sheet wick 20 is a tight fit within envelope 12. Vapor spaces 22 are formed in the regions of envelope 12 near where the edges of top sheet 14 and bottom sheet 16 join together.

Channels 21 and 23 are formed in the large surfaces of wick 20 to act as both capillary channels and vapor spaces. As seen in FIG. 1, channels 21 and channels 23, which are on opposite surfaces of wick 20, are oriented transverse to each other. It is also desirable to form them with such depths that the channels actually open up to each other where they cross. Such a pattern permits vapor and liquid generated at one surface, such as at top sheet 14 of envelope 12, to move to the other surface, such as sheet 16.

An appropriate quantity of liquid (not shown) is also placed within heat pipe 10 to act as the heat transfer fluid. The determination of the quantity of liquid to be used is a procedure which is well understood in the art of heat pipes. The liquid is placed into envelope 12 through access opening 25 on the edge of envelope 12 which is temporarily left unsealed for that purpose and to permit air and other non-condensible gases to be removed from within envelope 12.

The invention differs from conventional heat pipes in that the structure of top sheet 14, and also bottom sheet 16, is not a single thermally conductive material, but a layered configuration of metal foil and electrical insulating plastic film.

Figure 2:
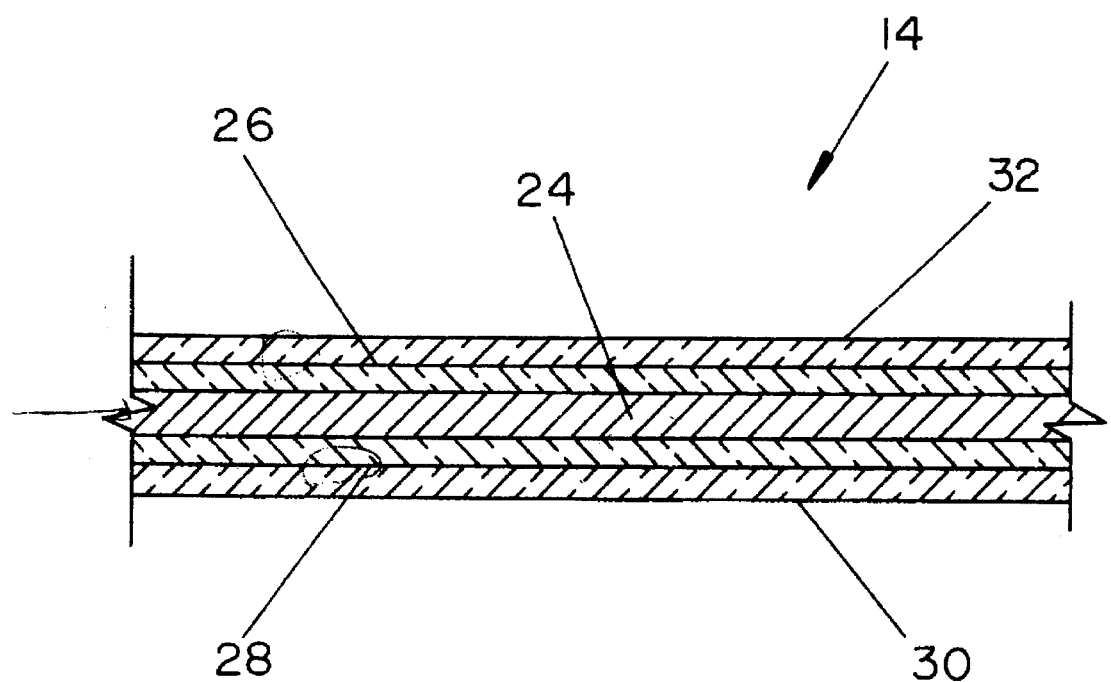
FIG. 2 is a cross section view of a portion of the envelope wall of the preferred embodiment of the invention.

As shown in FIG. 2 in which the thickness of the layers is greatly exaggerated, sheet 14 is constructed with central metal foil 24 covered on both its surfaces by insulating films 26, 28, 30, and 32. In theory only one such layer of insulating film is required to furnish the electrical insulating property required for the external surface of heat pipe 10 (FIG. 1). However, since it is more common in the production of coated foil to coat both sides, the preferred embodiment uses that material which is generally more available. Multiple plastic layers are generally used to attain a selection of characteristics such as strength, electrical insulation, bondability, and vacuum integrity which are not available in a single material. Furthermore, the use of metal foil with matching coatings on both sides simplifies the construction of heat pipe 10 because it is not necessary to orient the foil sheets in a particular direction, and the plastic material acts as a bonding agent for the edges as they are sealed together.

For the preferred embodiment shown in FIG. 1, a typical heat pipe has outside dimensions of 8.5 inches by 5.75 inches by 1/16 inch thick, and the internal foam sheet wick is 7.5 inches by 4.5 inches by 0.060 inch thick and made of porous polyethylene material sold under the trademark "Porex". Experimentation has shown that the foam sheet wick must be at least 0.030 inch thick for the heat pipe to operate satisfactorily. It is customary to further specify wick material by the volume of the wick structure which is occupied by solid material. For the preferred embodiment of the invention this factor may vary in the range between 20 to 80 percent solid. The channels formed in both surfaces of the wick of the preferred embodiment are 0.030 inch square in cross section and extend from edge to edge. Since each channel penetrates one half the thickness of the wick, the transverse channels meet and open up to each other at each crossing point.

The envelope walls are constructed from 0.001 inch thick aluminum foil and are coated on both sides with two additional layers. The inner layer is 0.001 inch thick mylar and the outer layer is 0.004 inch thick polypropylene.

The quantity of water used within the evacuated and sealed envelope should be approximately that volume required to completely fill the voids within the wick structure. For example, with the dimensions specified above, and assuming that approximately 50% of the wick is solid material, the water volume required is approximately 15 cubic centimeters.

The method of constructing heat pipe 10 is very simple. Envelope 12 is formed by conventional techniques for bonding together sheets of plastic coated metal foil, by sealing the two sheets 14 and 16 together around their peripheral edges 18 with heat and pressure. The bonding agent can be either polypropylene layers 30 and 32 or some other conventional bonding material. Envelope 12 is formed tightly around foam sheet 20 by placing foam sheet 20 between sheets 14 and 16 before sealing them together, but access opening 25 into the internal volume is left unsealed in one edge 18.

Purified water is then loaded into envelope 12 through access opening 25 until envelope 12 is full of water, thus forcing all the air out of envelope 12. The water is then used to create the internal vacuum within the envelope by heating and evaporating most of the water out of the envelope, and then sealing access opening 25 of envelope 12 as the water vapor is still moving out of the access opening and the appropriate quantity of water still remains in envelope 12.

Such a heat pipe can remove 10 watts from an integrated circuit which it contacts with a temperature rise for the integrated circuit of only 30 degrees centigrade above ambient temperature. The polypropylene external coating on the heat pipe provides electrical insulation for well above the typical voltages used in present computers and similar other applications.

The present invention thereby furnishes a simple heat pipe which is easy to construct and small and light enough to cool the integrated circuits within a laptop computer without requiring any significant increases in size or weight of the computer.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, foils, wicks, fluids, and insulating coating of other materials can be used, and thicknesses and other dimensions may be varied.

What is claimed as new and for which Letters patent of the United States are desired to be secured is:

1. A heat pipe comprising:
   a metal foil casing comprising two metal foil sheets joined and sealed together around the peripheral edges of the foil sheets to form an envelope, with non-condensible gases evacuated from the envelope;
   a sheet of foam material enclosed within the envelope so that the foil sheets are in contact with the sheet of foam and the edges of the foam sheet are adjacent to the peripheral edges of the envelope with transverse channels formed on opposite surfaces of the foam sheet;
   an electrically insulating coating covering the outside surfaces of the envelope; and
   a vaporizable liquid within the envelope.

2. The heat pipe of claim 1 wherein the channels on one side of the sheet open into the channels on the other side of the sheet.

3. The heat pipe of claim 1 wherein the foil sheets are aluminum.

4. The heat pipe of claim 1 wherein both foil sheets are the same dimensions.

5. The heat pipe of claim 1 wherein both foil sheets are at least 0.001 inch thick.

6. The heat pipe of claim 1 wherein the insulating coating is polypropylene material.

7. The heat pipe of claim 1 wherein the insulating coating is 0.004 inch thick.

8. The heat pipe of claim 1 wherein the insulating coating covers both surfaces of both foil sheets.

9. The heat pipe of claim 1 wherein the insulating coating comprises two layers of different materials.

10. The heat pipe of claim 1 further including vapor spaces between the edges of the foam sheet and the sealed edges of the foil sheets.

11. The heat pipe of claim 1 wherein the foam sheet is thermal insulating material.

12. The heat pipe of claim 1 wherein the foam sheet is porous polyethylene material.

13. The heat pipe of claim 1 wherein the foam sheet is at least 0.030 inch thick.

* * * * *